United States Patent [19]

Hatwar

[11] Patent Number: 4,885,134
[45] Date of Patent: Dec. 5, 1989

[54] SPUTTERING TARGET AND METHOD OF PREPARING THE SAME

[75] Inventor: Tukaram K. Hatwar, Penfield, N.Y.

[73] Assignee: Eastman Kodak Company, Rochester, N.Y.

[21] Appl. No.: 234,996

[22] Filed: Aug. 22, 1988

[51] Int. Cl.⁴ ............... G11B 7/24; B21C 37/00
[52] U.S. Cl. ................... 420/416; 148/301; 420/83; 420/590; 428/928
[58] Field of Search ............. 428/928; 420/83, 416, 420/590; 148/301

[56] References Cited

U.S. PATENT DOCUMENTS

| | | | |
|---|---|---|---|
| 4,378,258 | 3/1983 | Clark et al. ............ | 428/416 |
| 4,390,600 | 6/1983 | Ohta et al. ............ | 428/928 |
| 4,612,068 | 9/1986 | Tanaka .................. | 148/301 |
| 4,620,872 | 11/1985 | Hijikata et al. ........ | 75/246 |
| 4,645,722 | 2/1987 | Katayama et al. ...... | 428/928 |
| 4,670,353 | 6/1987 | Sakurai ................. | 148/311 |
| 4,693,943 | 9/1987 | Kishi et al. ............ | 428/928 |
| 4,710,434 | 12/1987 | Sato et al. ............. | 428/928 |
| 4,777,082 | 10/1988 | Ishizaki et al. ........ | 428/928 |
| 4,789,606 | 12/1988 | Yamada et al. ........ | 428/928 |

FOREIGN PATENT DOCUMENTS

| | | | |
|---|---|---|---|
| 2071696 | 9/1981 | Japan .................. | 148/301 |
| 0085502 | 5/1985 | Japan .................. | 148/301 |
| 1051806 | 3/1986 | Japan .................. | 148/301 |
| 1053703 | 3/1986 | Japan .................. | 148/301 |
| 62-99937 | 5/1987 | Japan . | |
| 62-200552 | 9/1987 | Japan . | |

*Primary Examiner*—Upendra Roy
*Attorney, Agent, or Firm*—Robert A. Gerlach

[57] ABSTRACT

Highly uniform alloy targets are prepared by melting together predetermined amounts of terbium iron and cobalt with an additional element selected from platinum, chromium, nickel, palladium, tantalum, hafnium or mixtures thereof in an argon atmosphere and casting the thus formed melt into a mold.

8 Claims, No Drawings

SPUTTERING TARGET AND METHOD OF PREPARING THE SAME

BACKGROUND OF THE INVENTION

This invention relates to sputtering targets and a method of preparing the same. More particularly, this invention relates to a sputtering target of terbium-iron-cobalt alloy having a uniform homogeneous structure free of cracks.

In the preparation of magnetooptical recording media, sputtering is an important procedure for depositing the magnetooptic media onto a substrate or other layer employed in the recording element. Terbium-iron-cobalt alloys are known to exhibit magnetooptic effect and therefore are important from this standpoint. U.S. Pat. No. 4,670,353, discloses and claims a terbium-iron-cobalt magnetooptical recording media.

It is desirable to prepare magnetooptic elements in a high throughput industrial apparatus. In addition to controlled processing parameters, it is essential that the sputtering targets have a uniform composition and structure. To achieve this goal, highly sophisticated techniques for preparing sputtering targets are available. Such techniques are not practical from a commercial standpoint where large quantities of thermo-magnetooptic elements are to be produced because of the economics involved.

Two apparently suitable techniques for preparing sputtering targets are by hot pressing and casting from the melt. Hot pressed targets, because of the presence of surface oxide in the starting powders, contain large quantities of oxygen. Targets prepared by casting contain low levels of oxygen which is desirable. However, the preparation of quality targets by this method, especially of terbium-iron-cobalt alloy, is extremely difficult, because the cast targets exhibit cracks, voids, defects and other non-uniformities such as, large grain size. These defects result, upon sputtering, in magnetooptic films with low compositional uniformity. Additionally, such targets are very brittle and susceptible to breakage or handling. Terbium-iron-cobalt alloy targets also are easily oxidized and disintegrate in atmospheric conditions.

SUMMARY OF THE INVENTION

Uniform, homogeneous sputtering targets are prepared by melting together terbium, iron and cobalt and at least one additional element selected from platinum, chromium, nickel, palladium, tantalum and hafnium, casting the molten alloy into a mold and cooling to solidify the alloy. The addition of a fourth element or a mixture of elements to the terbium-iron-cobalt permits the fabrication of uniform homogeneous castings suitable for use as sputtering targets. These castings are free of cracks and possess a grain size smaller than that of an alloy cast without the presence of an additional element. The present invention also facilitates the preparation of larger alloy targets with the appropriate mechanical and chemical stability and compositional uniformity. That is, the thus formed cast targets are mechanically strong and much less brittle than straight terbium-iron-cobalt targets made without a fourth element. Therefore, these targets are corrosion resistant and do not require storage under special inert conditions to prevent deterioration.

DETAILED DESCRIPTION OF THE INVENTION

In the preparation of sputtering targets in accordance with this invention, any suitable terbium-iron-cobalt composition may be employed such as, for example a composition as follows: from about 10 to about 40 atomic percent terbium, preferably from about 15 to about 30 percent terbium and most preferably from about 21 to 27 atomic percent terbium; from about 50 to about 85 atomic percent of iron, preferably from about 60 to about 80 atomic percent iron and most preferably from about 70 to about 79 atomic percent of iron and from about 5 to about 15 atomic percent cobalt, preferably from about 5 to about 10 atomic percent, and most preferably from about 6 to about 9 atomic percent of cobalt. To this mixture or alloy is added from about 2.5 to about 15 atomic percent of platinum, chromium, nickel, palladium, tantalum, hafnium or mixtures thereof. Preferably the last element or mixture of elements should be added in an amount of from about 5 to about 10 Atomic percent.

The alloy components employed in the preparation of the sputtering targets are melted together in a suitable crucible made of a material inert with respect to the components such as, for example, fused quartz, alumina, high strength ceramics, and the like. A preferred crucible is one made of boron nitride or one made of quartz coated with boron nitride.

The components of the alloy sputtering target present within the crucible are heated to a temperature from about 1200° C. to about 1700° C., preferably from about 1400° C. to about 1600° C. and most preferably at about 200° C. above the melting point of the alloy to maintain the fluidity of the melt. For the purpose of heating the components which form the alloy sputtering target, any suitable apparatus adapted for this purpose may be employed such as an induction coil connected to a low frequency generator. The crucible for heating the alloy components is disposed within the coil. While any suitable frequency may be employed to impart energy and cause the melting of the alloy components, low frequency induction heating is preferred since low frequency current creates a magnetic field in the charge which causes stirring of the melt in the crucible.

Because of the chemical nature of the components the melting of the ingredients and the casting operation is conducted in an inert atmosphere. Any suitable inert gas can be used such as, for example, argon, helium, xenon, neon and the like and mixtures thereof, although argon was generally used. In carrying out the melting operation, it is preferable to first exhaust the chamber in which the crucible and the casting apparatus are situated by a suitable vacuum system to a pressure generally on the order of $10^{-5}$ torr and then to back fill the chamber with an inert gas to a pressure of from about 100 torr to about 1,000 torr.

The charge in the crucible is heated until a temperature of at least 200° C. above the melting point of the alloy thus forming a melt. The temperature is held for at least 5 and preferably from 5 to 10 minutes until the melt becomes homogeneous due to the electromagnetic stirring associated with induction melting. The melt from the crucible is then cast into a mold having the desired configuration. The mold is made of a material inert with respect to the alloy being cast therein. The same materials may be utilized to prepare the mold as that employed in the preparation of the crucible. A boron nitrite coated quartz mold having a diameter of from 2 to 4 inches and permitting a casting 0.3 inches thick is preferred. When the alloy casting has cooled and solidified it is removed from the mold and can be employed as a sputtering target. The casting is allowed to cool to room temperature, either naturally or at an accelerated rate by the introduction of an inert gas.

Sputtering targets prepared by the process of this invention have a fine grain uniform composition and structure and are physically sound and crack free. Depending upon the size and configuration of the mold, targets of various size and shape can be produced having reasonably flat top and bottom surfaces which can easily be polished to render them suitable as sputtering targets.

Thin films were prepared by sputtering utilizing the targets having a two inch diameter made in accordance with this invention. After 15 hours of sputtering at 3 to 10 millitorr argon pressure and 150 watts of power, target surfaces were smooth and had a uniform erosion pattern whereas the surface of straight terbium-iron-cobalt target was non-uniform. Further, films prepared in accordance with the invention were tested to determine the magnetooptic properties. Even though films of the present invention exhibited a slightly lower Kerr rotation when compared to straight terbium-iron-cobalt film, carrier to noise ratio remained unaffected.

In addition, films deposited from targets prepared in accordance with this invention are more uniform than those prepared with terbium-iron-cobalt targets without an additional element as required by this invention. For example, when coercivity is plotted as a function of the radial distance from the center of a 3.5 inch diameter disk deposited from a 2 inch diameter alloy target using a DC magnetron gun, there is less variation in coercivity over the area when the practice of this invention is conducted in comparison to a comparable film sputtered from a terbium-iron-cobalt target without an additional element being present. The films prepared in accordance with this invention are much more corrosion resistant than those made with terbium-iron-cobalt films without the addition of a fourth element. Electrochemical immersion tests in 0.005 molar potassium chloride/chloroacetate buffer was carried out to compare the corrosion rates. Optical absorption through the film gives a measure of corrosion. Terbium-iron-cobalt films are severely corroded or almost dissolved in this solution within 2.5 hours of immersion and a large change in optical absorption is observed. Films prepared in accordance with this invention containing 5—15 atomic percent of the fourth element demonstrate substantially less deterioration in this immersion test. In most instances the change in absorption is less than half of that observed for terbium-iron-cobalt without an additional element. Because of the high corrosion resistance of the targets prepared in accordance with this invention, they do not have to be stored in controlled atmosphere ($O_2$ and $H_2O$ vapor free environment) unlike terbium-iron-cobalt targets. In fact they can be stored in atmospheric conditions without deterioration. Terbium, iron and cobalt targets when stored under ambient conditions for the same period of time showed serious deterioration.

Also, because of the high mechanical strength and the less brittle nature of targets prepared in accordance with this invention, they are more easily machined and physically handled preparatory to and during the formation of thermo-magnetooptic elements.

EXAMPLE 1

(Comparison)

About 170 grams of charge corresponding to the composition $Tb_{27}Fe_{64}Co_9$ was placed into a boron-nitride coated quartz crucible in a furnace capable of being evacuated and supplied with an inert gas. The furnace chamber was evacuated to 50 millitorr and then filled with argon This step was repeated three times and finally the chamber was filled with argon to 1000 psi. The alloy charge was melted by induction melting. The temperature of the melt was raised to 1500° C. (about 200° C. above the melting point of the terbium-iron-cobalt alloy) to maintain the fluidity of the melt and it was held at that temperature for five minutes. After evacuating the chamber to 100 millitorr, the melt was poured into a boron-nitride coated quartz mold and the casting was allowed to cool to room temperature. Inspection of the casting showed that it was broken into three pieces.

EXAMPLE 2

(Comparison)

Another charge corresponding to the alloy composition $Tb_{25}Fe_{55}Co_{20}$ was melted in a similar way and cast in the mold. When the casting was cooled, it broke into three or more pieces.

EXAMPLE 3

About 160 grams of charge corresponding to a composition containing 2.5 atomic percent of Pd and having the composition $[Tb_{27}Fe_{64}Co_9]_{97.5}Pd_{2.5}$ was melted and cast following the procedure of Example 1 and cooled. While casting was broken into two large pieces, they were much less brittle and stronger than the pieces obtained in Example 1.

EXAMPLE 4

About 163.4 grams of charge corresponding to the alloy composition of $[Tb_{27}Fe_{64}Co_9]_{95}Pd_5$ was melted and poured into a mold by following the procedure of Example 1. When the casting was cooled, a single piece 2" diameter×0.5" thick casting was obtained. Both the top and bottom surfaces of the casting were flat. Top and bottom surfaces of the casting were polished. No fine cracks in the casting were visible. Fine grained structure was seen under the optical metallographic microscope. The composition analysis of the samples from different areas of the target indicated that the target is uniform in composition.

EXAMPLE 5

About 172 grams of charge corresponding to the alloy composition $[Tb_{27}Fe_{64}Co_9]_{85}Pd_{15}$ was melted and cast in accordance with the procedure of Example 1. A single piece uncracked casting was obtained.

EXAMPLE 6

(Comparison)

A 2 inch target, prepared by bonding together the pieces prepared in accordance with Example 1, was sputtered using a 2 inch DC magnetron gun, a substrate to target distance of 4.25 inches, a sputtering argon pressure of 3 millitorr and a power of 150 watts. The substrate was a 3.5 inch glass disk.

EXAMPLE 7

The procedure of Example 6 was repeated using a target prepared in accordance with Example 1 but having a composition. $[Tb_{27}Fe_{64}Co_9]_{90}Pd_{10}$. The radial profile of coercivity of the Kerr hysteresis loop of the sputtered layers of Examples 6 and 7 were measured. The layer of Example 7 showed a more uniform structure than that of Example 6. The target of Example 7 after 15 hours of sputtering had a uniform erosion pattern while the target of Example 1 was rough and nonuniform. The target of Example 1 degraded after storage for about 6 months at ambient conditions. The targets of Examples 3, 4, 5 and 7 did not show any deterioration upon storage under the same conditions and time.

X-ray powder diffraction studies indicated that $Tb_{27}Fe_{64}Co_9$ alloy contains two types of major intermetallic phases, cubic ($TbFe_2$ type) and rhombohedral ($TbFe_3$ type). Cobalt atoms substitute the iron atoms in the lattice. X-ray powder diffraction from $[Tb_{27}Fe_{64}Co_9]_{90}Pd_{10}$ alloy, i.e. with the addition of 10 atomic percent of palladium into $Tb_{27}Fe_{64}Co_9$, showed that an additional third phase rhombohedral ($Tb_2Fe_{17}$ type) is precipitated. Thus the increased mechanical strength of the terbium-iron-cobalt alloy with the addition of a fourth element appears due to the well known precipitation hardening mechanism in physical metallurgy.

When similar experiments are conducted utilizing chromium, nickel, hafnium and tantalum as the fourth element in a terbium-iron-cobalt alloy sputtering target, similar results to those obtained in Examples 3, 4, 5, and 7 are obtained.

What is claimed is:

1. A sputtering target comprising a fine grain, physically sound, uniform composition, uniform structure corrosion resistant alloy of terbium, iron and cobalt and containing from about 2.5 to about 15 atomic percent of an element selected from the group consisting of platinum, chromium, nickel, palladium, tantalum and hafnium.

2. The sputtering target of claim 1 wherein the element is platinum.

3. The sputtering target of claim 1 wherein the element is chromium.

4. The sputtering target of claim 1 wherein the element is nickel.

5. The sputtering target of claim 1 wherein the element is palladium.

6. The sputtering target of claim 1 wherein the element is tantalum.

7. The sputtering target of claim 1 wherein the element is hafnium.

8. The sputtering target of claim 1 wherein terbium is present in the alloy in an amount of from about 10 to about 40 atomic percent iron an amount of from about 50 to about 85 atomic percent and cobalt in an amount of from about 5 to 15 atomic percent.

* * * * *